United States Patent [19]

Gross et al.

[11] Patent Number: 4,613,769
[45] Date of Patent: Sep. 23, 1986

[54] DIRECT CURRENT COUPLED PEAK TO PEAK DETECTOR CIRCUIT

[75] Inventors: William H. Gross, Sunnyvale, Calif.; Toyojiro Naokawa, Saitama, Japan

[73] Assignee: National Semiconductor Corporation, Santa Clara, Calif.

[21] Appl. No.: 639,880

[22] Filed: Aug. 13, 1984

[51] Int. Cl.⁴ .................. H03K 5/153; G01R 19/04
[52] U.S. Cl. ........................... 307/351; 307/261; 328/151
[58] Field of Search .............. 307/351, 354, 350, 261; 328/150, 151; 324/103 P

[56] References Cited

U.S. PATENT DOCUMENTS 4,229,735 10/1980 Houck ................................. 307/351
4,446,486 5/1984 Itoh ..................................... 307/351

Primary Examiner—John Zazworsky
Attorney, Agent, or Firm—Gail W. Woodward; Paul J. Winters

[57] ABSTRACT

A peak-to-peak signal detector circuit is disclosed. It can be directly coupled and rejects any d-c component associated with the signal without requiring a coupling capacitor. The input is applied to separate positive and negative peak detectors the outputs of which are subtractively combined in an op-amp. A circuit application as a drop out detector in an optical disc system is detailed.

3 Claims, 8 Drawing Figures

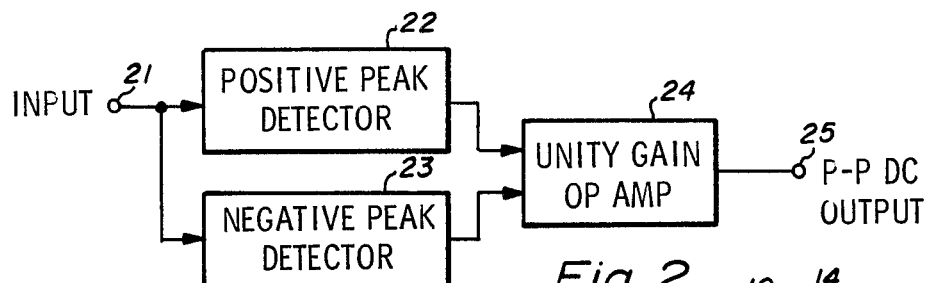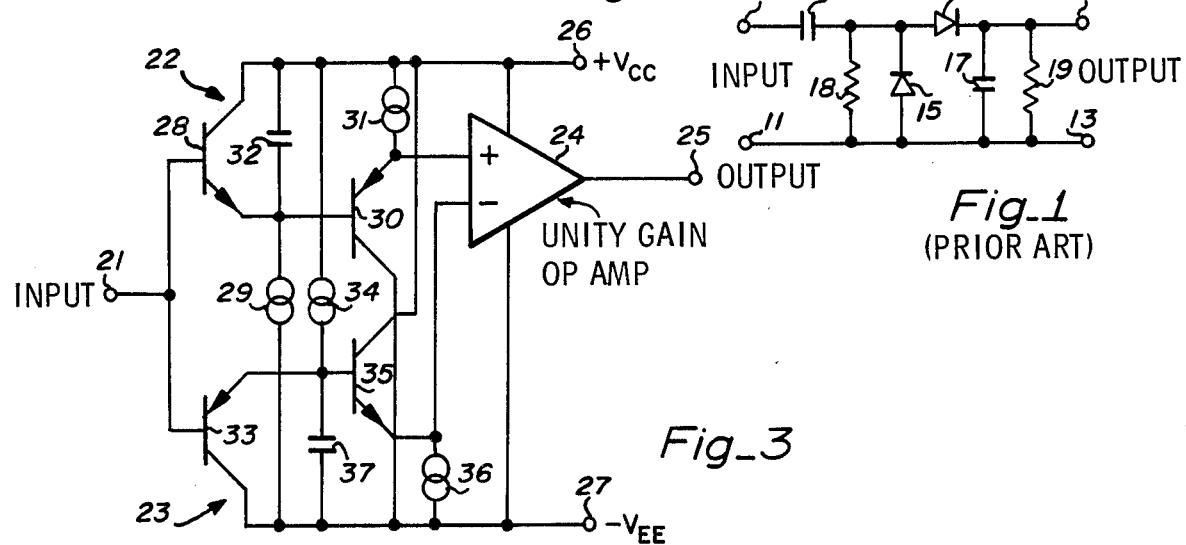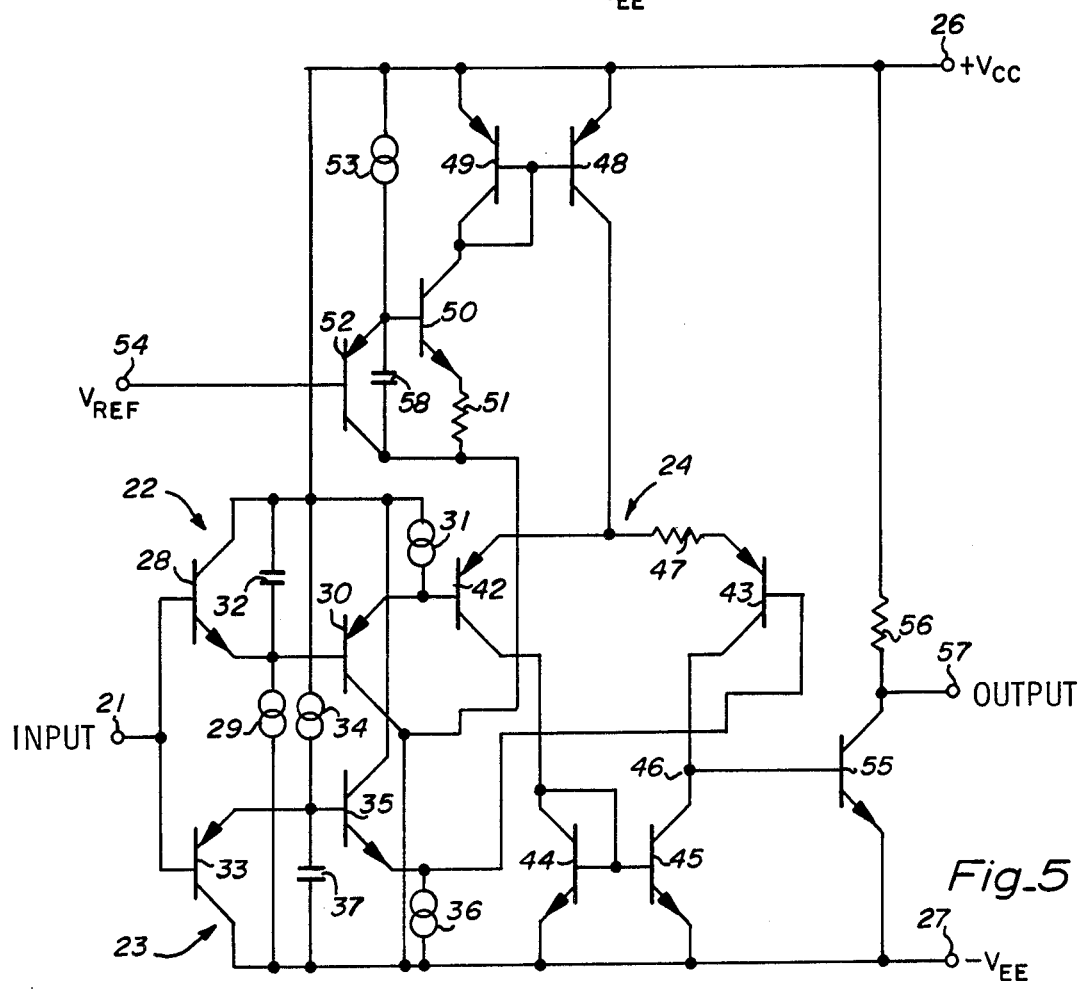

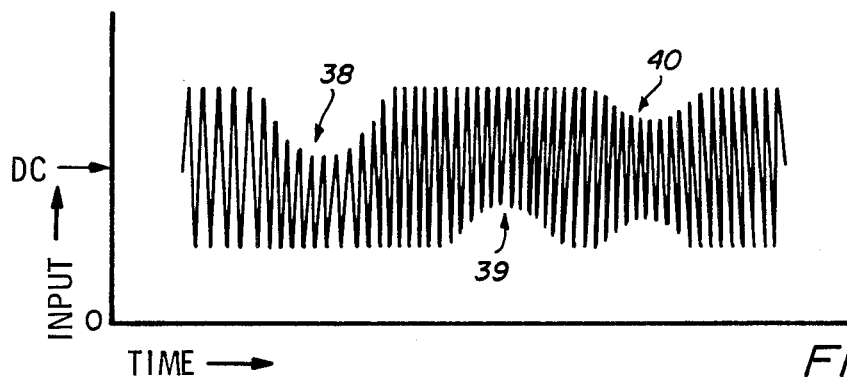
Fig_4A
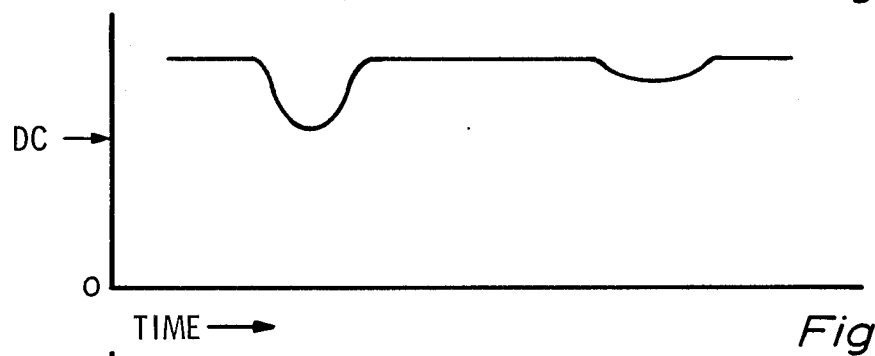
Fig_4B
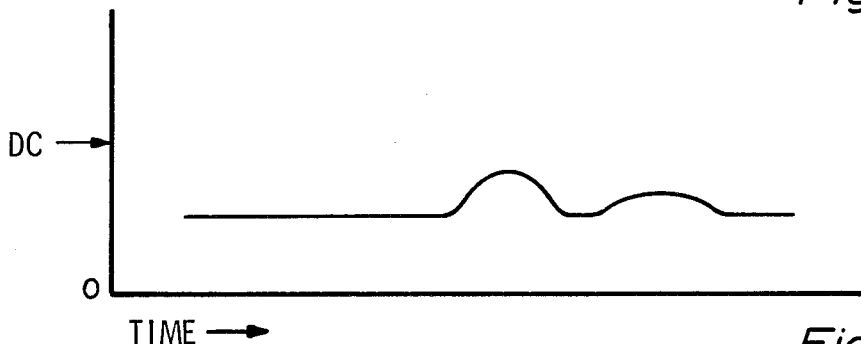
Fig_4C
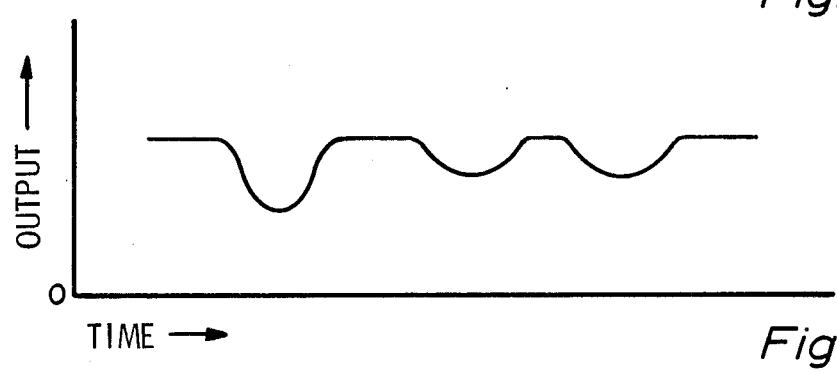
Fig_4D

DIRECT CURRENT COUPLED PEAK TO PEAK DETECTOR CIRCUIT

BACKGROUND OF THE INVENTION

The invention relates to a detector circuit intended to produce an output related to the peak to peak signal input and that can be directly coupled. That is, no d-c blocking capacitor is needed for coupling to the signal source. The circuit is intended for use in optical disc applications where the signal to be processed has an a-c envelope that must be peak to peak detected and may contain a superimposed d-c level. Our copending application Ser. No. 619,965, filed June 12, 1984, is titled MATRIX CIRCUIT FOR OPTICAL DISC SYSTEMS and is assigned to the assignee of the present invention. This copending application discloses some optical disc circuitry and its teaching is incorporated herein by reference. The main application of the present invention is in drop out detection wherein a loss of signal must be sensed and flagged. In the drop out state the input signal peak to peak value falls below some predetermined value thereby showing a system failure.

In the optical disc system light is reflected from a modulated spiral record track and focused upon a photodetector. The photodetector output has a d-c value related to average light value and a superimposed a-c data signal. The a-c signal component can have its value vary in terms of the negative peaks, the positive peaks, or both. Therefore, it is necessary to sense the peak to peak signal in order to determine the signal quality. Desirably this will be accomplished in the presence of the d-c signal average value which must not interfere with the detection function.

SUMMARY OF THE INVENTION

It is an object of the invention to provide a peak to peak signal detector that requires no coupling capacitor and can be directly coupled to a signal source having a d-c component.

It is a further object of the invention to provide a detector that can respond to an a-c signal in the presence of a d-c signal and provide an indication when the a-c signal falls below a predetermined minimum value.

These and other objects are achieved in the following manner. The input signal is directly coupled to positive and negative peak detectors. The detector outputs are substractively combined in a unity gain operational amplifier (op-amp) having differential input terminals. The result is a d-c output that is related to the peak-to-peak signal input. This configuration effectively doubles the signal frequency which makes filtering easier and speeds up the response to signal level changes. In the preferred embodiment the peak detectors comprise cascaded complementry emitter followers. This provides a high input impedance and close to zero level shift. Thus, the d-c input component is seen as an op-amp common mode signal which is effectively rejected. The differential inputs subtractively combine the positive and negative peak detector outputs thereby to develop an output related to the peak to peak signal input.

The peak to peak detector can be employed in a drop out detector by coupling the output of the op-amp to a level indicator and by introducing a controlled offset voltage in the op-amp input. As long as the input signal exceeds the offset the level indicator will be in a first stage. However, when the input signal peak to peak value falls below the offset value the level indicator will be in a second state that flags a dropout.

BRIEF DESCRIPTION OF THE DRAWING

FIG. 1 shows a typical prior art peak to peak detector.

FIG. 2 is a block diagram of the circuit of the invention.

FIG. 3 is a schematic diagram of the circuit of the invention.

FIGS. 4A–4D are a set of graphs showing the operation of the circuit of FIG. 3.

FIG. 5 is a schematic diagram of a drop out detector.

DESCRIPTION OF THE PRIOR ART

FIG. 1 shows a prior art peak to peak detector circuit. A signal input applied to terminals 10 and 11 produces a d-c output at terminals 12 and 13 that is related to the peak to peak input. On the negative input peaks capacitor 14 is charged via diode 15. On the positive input peaks diode 16 charges capacitor 17 to the peak to peak input value. For this input polarity, the charge on capacitor 14 adds to input peak. Resistor 18, which acts when diode 15 is reverse biased, forms a long RC time constant with capacitor 14 at the signal frequency. Resistor 19 forms a similar time constant with capacitor 17. The D-C output at terminals 12–13 will be equal to the peak to peak input less the forward voltage drops of diodes 15 and 16. For small input signals, on the order of a few volts, the diode offset is appreciable and introduces substantial error. Also, the d-c output will not follow rapid input signal level changes.

DESCRIPTION OF THE INVENTION

FIG. 2 is a block diagram illustrating the invention. Input terminal 21 applies signals to positive peak detector 22 and negative peak detector 23. The peak detectors are coupled to the inputs of a unity gain op-amp 24 which provides a subtractive signal combination thereby producing a peak to peak related response at output terminal 25.

FIG. 3 shows a preferred way of forming the peak detectors. The circuit operates with a power supply connected to the $+V_{CC}$ terminal 26 and $-V_{EE}$ terminal 27. NPN transistor 28 is coupled as an emitter follower with current sink load 29 to drive complementary emitter follower transistor 30 which employs current source 31 as its load. Such cascaded emitter followers have very close to unity gain and zero level shift. Capacitor 32 converts emitter follower 28 to a positive signal peak detector. As terminal 21 goes positive transistor 28 turns on to discharge capacitor 32 to a level related to the signal peak. Thus, the noninverting input of op-amp 24 will rapidly seek a level equal to the positive signal peak of terminal 21. As terminal 21 drops below this level capacitor 32 will hold the base of transistor 30 at peak level until the next signal peak.

In the negative peak detector 23, PNP transistor 33 is coupled as an emitter follower using current source 34 as a load to drive complementary emitter follower 35 which uses current sink 36 as a load. Capacitor 37 converts emitter follower 33 to a negative peak detector. Thus, the negative input peaks at terminal 21 are detected and coupled to the inverting input of op-amp 24. If op-amp 24 has unity gain, as shown, the output at terminal 25 is related to the peak-to-peak input. Any d-c input at terminal 21 is directly coupled to both op-amp inputs where it is rejected as a common mode signal.

Thus, no coupling capacitor is required for d-c signal rejection.

FIG. 4 is a series of graphs showing the operation of the invention in its optical disc application. FIG. 4A is a plot of the typical photo-detected optical disc signal. The signal has a d-c level established by a photodetector. The optically recorded signal represents a carrier-like a-c signal superimposed on the d-c signal. Three kinds of variations are typically encountered in such a system. At 38 a reduction in positive peaks is shown. At 39 a reduction of the negative peaks (reduced swing) is shown. At 40 both the positive and negative peaks are shown reduced. FIG. 4B shows the signal at the emitter of transistor 30 which follows the positive peak variations. In FIG. 4C the signal at the emitter of transistor 35 is shown following the negative peaks. FIG. 4D shows the circuit output at terminal 25. Note that the output follows each kind of signal reduction.

FIG. 5 is a schematic diagram of the invention as applied to a drop out detector. Where the parts function as in FIG. 3 the same numerals are used. Op-Amp 24 is composed of differentially-connected transistors 42 and 43 which are driven differentially by transistors 30 and 35 respectively which represent the outputs of the positive and negative peak detectors 22 and 23. Transistors 44 and 45 provide a single ended output for the op-amp at node 46. Resistor 47 is present to establish an offset as will be described hereinafter. Transistor 48 provides tail current for transistors 42 and 43 and is driven from diode-connected transistor 49 as a current mirror. The current in transistor 49 is the current in transistor 50 and resistor 51 and is set by the action of emitter follower transistor 52 and its current source load 53. A fixed potential $V_{REF}$ is applied to terminal 54. Due to the action of cascaded complementary emitter followers 50 and 52 $V_{REF}$ will appear at the upper end of resistor 51. If $V_{REF}$ is referenced to $-V_{EE}$ its value will appear across resistor 51. Thus, the current in resistor 51 is $V_{REF}/R51$. If the current mirror (transistors 48 and 49) has unity gain, the same current will flow in transistor 48 as op amp 24 tail current. When op-amp 24 is balanced one-half of the tail current will flow in resistor 47 so as to introduce an offset. For this condition the base of transistor 43 will have to be below the base of transistor 42 by the drop across resistor 47. Thus, this voltage is an effective offset in op-amp 24. This offset will be:

$$V_{OS} = V_{REF}/2R51 \cdot R47 = V_{REF}/2 \cdot R47/R51$$

This says that the offset is equal to the ratio of resistors 47 and 51 multiplied by one-half of $V_{REF}$. This offset will represent a particular value of peak-to-peak signal input at terminal 21.

As the peak-to-peak signal value falls below the balance level, transistor 42 will conduct more heavily than transistor 43. This will pull node 46 down and turn transistor 55 off. Resistor 56 will then pull output terminal 57 high to flag a signal drop out.

When the peak-to-peak signal value rises above the balance level, transistor 43 will conduct more heavily than transistor 42 and node 46 will be pulled up. This turns transistor 55 on so that output terminal 57 will be low. This flags a signal above the drop out level.

If desired, capacitor 58 can be employed to convert transistor 52 into a peak detector. Then terminal 54 can be capacitively coupled (not shown) to the signal source. In this case, $V_{REF}$ is an adaptive bias voltage related to the peak signal input level. Since this signal is a function of the reflectivity of the optical disc being played, this creates an adaptive bias which provides a self compensating $V_{REF}$ that adjusts itself as a function of the optical signal level.

EXAMPLE

The circuit of FIG. 5 was constructed in conventional monolithic pn junction isolated IC form. The transistors were all of high Beta construction. The following component values were:

| COMPONENT | VALUE |
|---|---|
| current sink 29 | 1 uamp |
| current source 31 | 10 uamps |
| current source 34 | 1 uamp |
| current sink 36 | 10 uamps |
| capacitors 32 and 37 | 10 picofarads |
| Resistor 47 | 5.1K ohms |
| Resistor 51 | 3.9K ohms |
| current source 53 | 10 uamps |

With $V_{REF}$ about 1 volt above $-V_{EE}$, the offset level, or drop out voltage, was about 650 millivolts which was regarded as suitable for the optical disc system.

The invention has been described and a working example given. When a person skilled in the art reads the foregoing description, alternatives and equivalents, within the spirit and intent of the invention, will become apparent. Accordingly, it is intended that the scope of the invention be limited only by the claims that follow.

We claim:

1. A direct current coupled peak-to-peak detector circuit having an input terminal connectable to a source of signal to be detected and a direct current output related to the peak-to-peak value of the input signal a-c component, said circuit comprising:

a positive peak detector comprising a first emitter follower driven from said source of signal to be detected and having a filtering capacitor coupled thereto to form a peak detector and a second emitter follower complementary to said first emitter follower and having an input driven therefrom, said second emitter follower having an output whereby any offset in said first emitter follower is substantially cancelled;

a negative peak detector comprising a first emitter follower driven from said source of signal to be detected and having a filtering capacitor coupled thereto to form a peak detector and a second emitter follower complementary to said first emitter follower and having an input driven therefrom, said second emitter follower having an output whereby any offset in said first emitter follower is substantially cancelled; and an operational amplifier having differential inputs and a single ended output for subtractively combining the outputs of said positive peak detector and said negative peak detector.

2. The circuit of claim 1 wherein said operational amplifier has unity gain, whereby said single ended output produces a signal equal to the difference between said outputs of said peak detectors.

3. The circuit of claim 1 wherein said operational amplifier is provided with an offset potential to establish a source signal threshold below which a logic one is developed to indicate a drop out and above which a logic zero is developed.

* * * * *